United States Patent [19]
Atarodi

[11] Patent Number: 5,465,072
[45] Date of Patent: Nov. 7, 1995

[54] TUNABLE OPERATIONAL TRANSCONDUCTANCE AMPLIFIER HAVING HIGH LINEARITY

[75] Inventor: Mojtaba Atarodi, Santa Clara, Calif.

[73] Assignee: Linear Technology Corporation, Milpitas, Calif.

[21] Appl. No.: 286,526

[22] Filed: Aug. 5, 1994

[51] Int. Cl.$^6$ .............................. H03G 3/30; H03F 3/45
[52] U.S. Cl. ...................... 330/254; 330/258; 330/305; 330/311
[58] Field of Search ..................... 330/254, 258, 330/311, 305

[56] References Cited

U.S. PATENT DOCUMENTS

| | | | |
|---|---|---|---|
| 3,731,215 | 5/1973 | Peil et al. | 330/254 |
| 5,111,159 | 5/1992 | Arakawa | 330/254 |
| 5,166,635 | 11/1992 | Shih | 330/258 X |
| 5,168,243 | 12/1992 | Feliz et al. | 330/252 |

FOREIGN PATENT DOCUMENTS

| 133810 | 6/1987 | Japan | 330/254 |
|---|---|---|---|

OTHER PUBLICATIONS

Liu, "Differential Variable-Gain Amplifier" IBM Technical Disclosure Bulletin, vol. 15, No. 5 Oct. 1972, pp. 1444–1445.
M. Koyama et al., "A 10.7 MHz Continuous-Time Bandpass Filter Bipolar IC", Reprinted from IEEE Proc. CICC, pp. 25.2.1–25.2.4, 1989.

*Primary Examiner*—James B. Mullins
*Attorney, Agent, or Firm*—Flehr, Hohbach, Test, Albritton & Herbert

[57] ABSTRACT

An amplifier capable of being tuned to provide linear gain over a selected input signal range is disclosed herein. The amplifier includes an input stage for receiving an input signal. The amplifier further includes a tuning circuit, connected between the input stage and an amplifier output stage, for controlling gain of the amplifier by adjusting a tuning current supplied to the amplifier output stage. The tuning circuit may be realized with a differential transistor pair connected to a pair of transistors within the output stage. In a preferred implementation the input and output stages are arranged in a folded-cascode configuration so as to improve the output impedance and input common-mode signal range of the amplifier.

11 Claims, 8 Drawing Sheets

TUNABLE OPERATIONAL TRANSCONDUNCTANCE AMPLIFIER HAVING HIGH LINEARITY

FIELD OF THE INVENTION

This invention relates generally to an operational transconductance amplifier and, more particularly, to an operational transconductance amplifier in which a tuning circuit is employed to control transconductance through adjustment of an amplifier tuning current.

BACKGROUND OF THE INVENTION

Interest has recently arisen in developing wideband continuous-time filters for use in high-definition television (HDTV) systems, as well as within high-speed analog to digital converters (ADCs). High-speed, low distortion, and a wide linear tuning range are several of the desired characteristics of continuous-time filters suitable for employment in such applications.

One type of continuous-time filter is realized using operational transconductance amplifier-capacitance (i.e., OTA-C) filters. Wideband OTA-C filters require the availability of wideband operational transconductance amplifiers (OTAs), which may be implemented using bipolar junction (BJT) technology. Although BJT technology offers superior high-frequency performance, there exist few techniques for designing broadband bipolar OTA amplifiers, especially those designed using BJT transconductance capacitor (gm-c) configurations. In addition, the potential advantages afforded by OTAs implemented using, for example, BJT technologies have not as yet been realized due to the reluctance of circuit designers to include lateral PNP transistors of low cut-off frequency ($f_T$) within the signal path. However, recent advances in complementary BJT processing techniques have provided an opportunity for more flexible circuit design.

In conventional bipolar OTAs, a linear gain response is produced to input signals within a selected input dynamic range by setting the gain of the input stage by adjusting the bias current therethrough. That is, in order to design an OTA capable of producing a linear output in response to large input signals, it is desired to set the gain of the input stage at a relatively high level by increasing bias current. However, a large degenerative emitter resistance is often included in the input stage in order to reduce the output distortion produced in response to selected differential input signals, which reduces the tuning range of the OTA. That is, such emitter degeneration reduces the maximum degree to which the gain of the input stage may be changed by altering bias current, and hence limits the dynamic range of input signals capable of being accommodated by the OTA. Although emitter degeneration leads to the desired operating characteristics of increased input impedance and reduced input capacitance, a need exists for an OTA capable of providing both a wide tuning range in addition to such desired operating characteristics.

OBJECTS AND SUMMARY OF THE INVENTION

Accordingly, it is an object of the present invention to provide a low-distortion operational transconductance amplifier capable of being tuned to exhibit linear gain in response to a wide range of input signals.

It is a further object of the present invention to provide a complementary bipolar implementation of such a tunable operational transconductance amplifier having improved high-frequency performance.

The foregoing and other objects of the invention are achieved in an amplifier capable of being tuned to provide linear gain over a selected input signal range. The amplifier includes an input stage for receiving an input signal. The amplifier further includes a tuning circuit, connected between the input stage and an amplifier output stage, for controlling gain of the amplifier by adjusting a tuning current supplied to the output stage.

The tuning circuit may be realized with a differential transistor pair connected to a pair of transistors within the input stage. In a preferred implementation the input and output stages are arranged in a folded-cascode configuration so as to improve amplifier output impedance.

DESCRIPTION OF THE DRAWINGS

Additional objects and features of the invention will be more readily apparent from the following detailed description and appended claims when taken in conjunction with the drawings, in which:

DETAILED DESCRIPTION OF THE PREFERRED EMBODIMENT

The present invention relies on a tuning circuit operative to adjust the transconductance of an operational transconductance amplifier by controlling the bias current supplied to the amplifier input stage. The tuning circuit advantageously enables the transconductance of the amplifier to remain a function of the bias current even when a degenerative resistance is incorporated within the input stage. In this way the inclusion of the tuning circuit allows tuning (i.e., bias current adjustment) over a wide input dynamic range, and preserves the high input impedance associated with resistively degenerated amplifier input stages.

Figure 1:
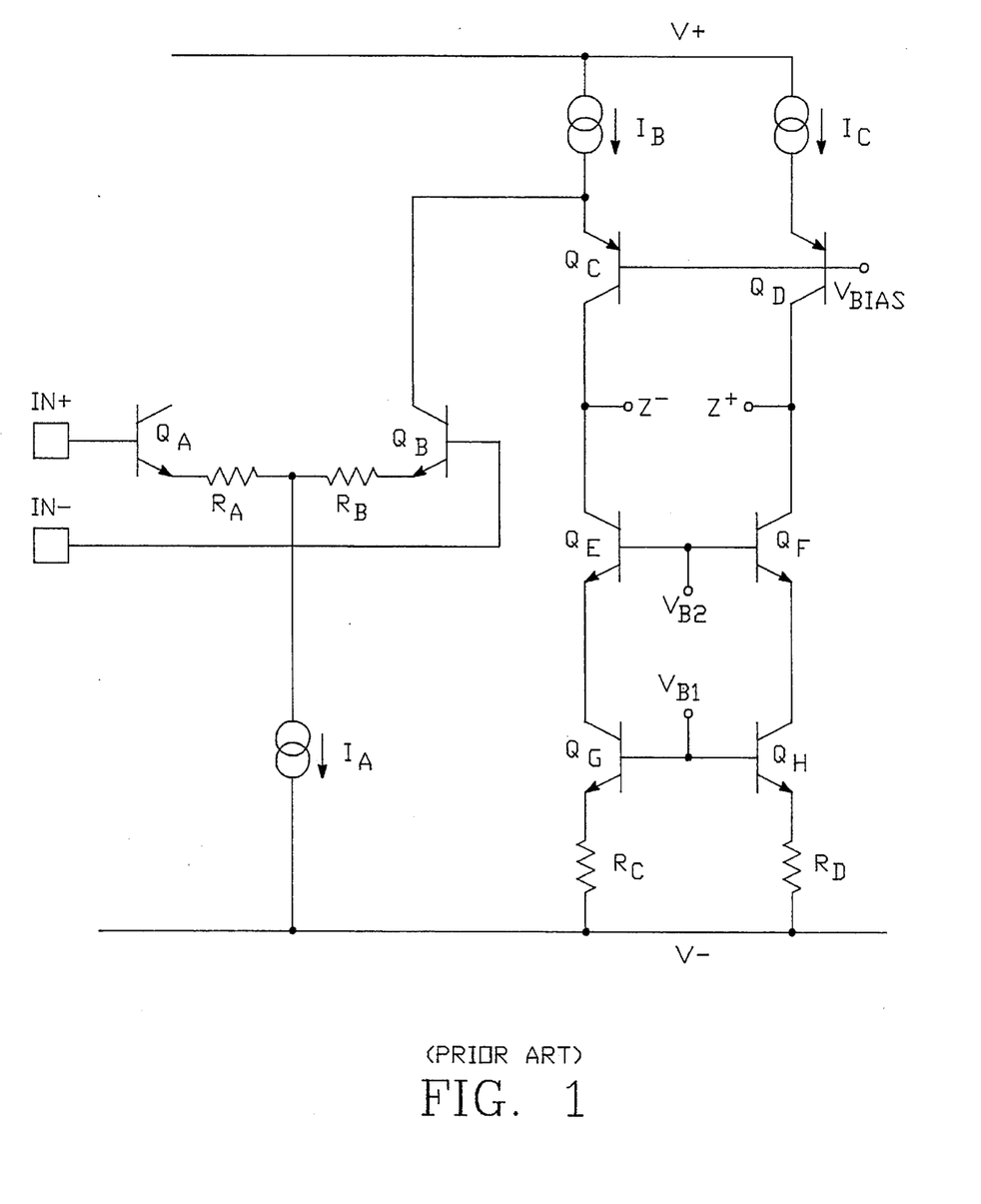
FIG. 1 shows a conventional differential operational transconductance amplifier having a single gain stage configuration known as a folded cascode.

Turning now to FIG. 1, there is shown a conventional differential operational transconductance amplifier (OTA) 1 having a single gain stage configuration known as a folded cascode. The amplifier operates by converting a differential input voltage (IN+, IN−), which appears across the bases of transistors $Q_A$, $Q_B$ and emitter degenerative resistors $R_A$ and $R_B$, to a differential current. Current sources $I_B$ and $I_C$ are seen to be connected to transistors $Q_C$ and $Q_D$. The OTA 1 further includes a current mirror (consisting of $Q_E$, $Q_F$, $Q_G$, $Q_H$, $R_C$, $R_D$), and differential high impedance output nodes $Z^+$ and $Z^-$.

For small values of $R_A$ and $R_B$ the transconductance ($g_m$) of the input section ($Q_A$, $Q_B$), and hence also gain of the amplifier, is set by current source $I_A$. However, for larger values of $R_A$ and $R_B$, such as for those values required to effect linear operation over a wide input dynamic range, and for those necessary to achieve a high level of input impedance, the $g_m$ value of the input stage tends to become relatively insensitive to the value of $I_A$. More particularly, a high-circuit analysis of the circuit of FIG. 1 leads to the following expression for the low-frequency, short-circuit transconductance ($G_{mO}$) of the amplifier of FIG. 1:

$$G_{mO}=(g_{mF}r_{\pi F}/g_{mF}r_{\pi F}+1)(g_{mA}r_{\pi A}/r_A+r_{\pi A}+R_{EE}(1+g_{mA}r_{\pi A})=g_{mA}/1+g_{mA}R_{EE}=1/R_{EE} (\text{For very large } R_{EE})$$

where $g_{MA}$, $g_{mF}$, $r_{\pi A}$, $r_{\pi F}$ and $r_{bA}$ are the parameters defining a bipolar transistor hybrid-π small-signal equivalent circuit model of transistors $Q_A$ and $Q_C$. As is made apparent by equation (3), the transconductance gain of the amplifier remains at approximately ($1/R_{EE}$) irrespective of value of $I_A$. Hence, the large degenerative emitter resistance $R_{EE}$ prevents the gain of the amplifier of FIG. 1 from being tuned on the basis of the magnitude of $I_A$. As is described hereinafter, the present invention contemplates a transconductance amplifier topology in which a tuning circuit in the form of an intermediate gain stage allows the value of $g_m$ to be controlled through adjustment of a tuning current, even in the presence of a large degenerative emitter resistance.

Figure 2A:
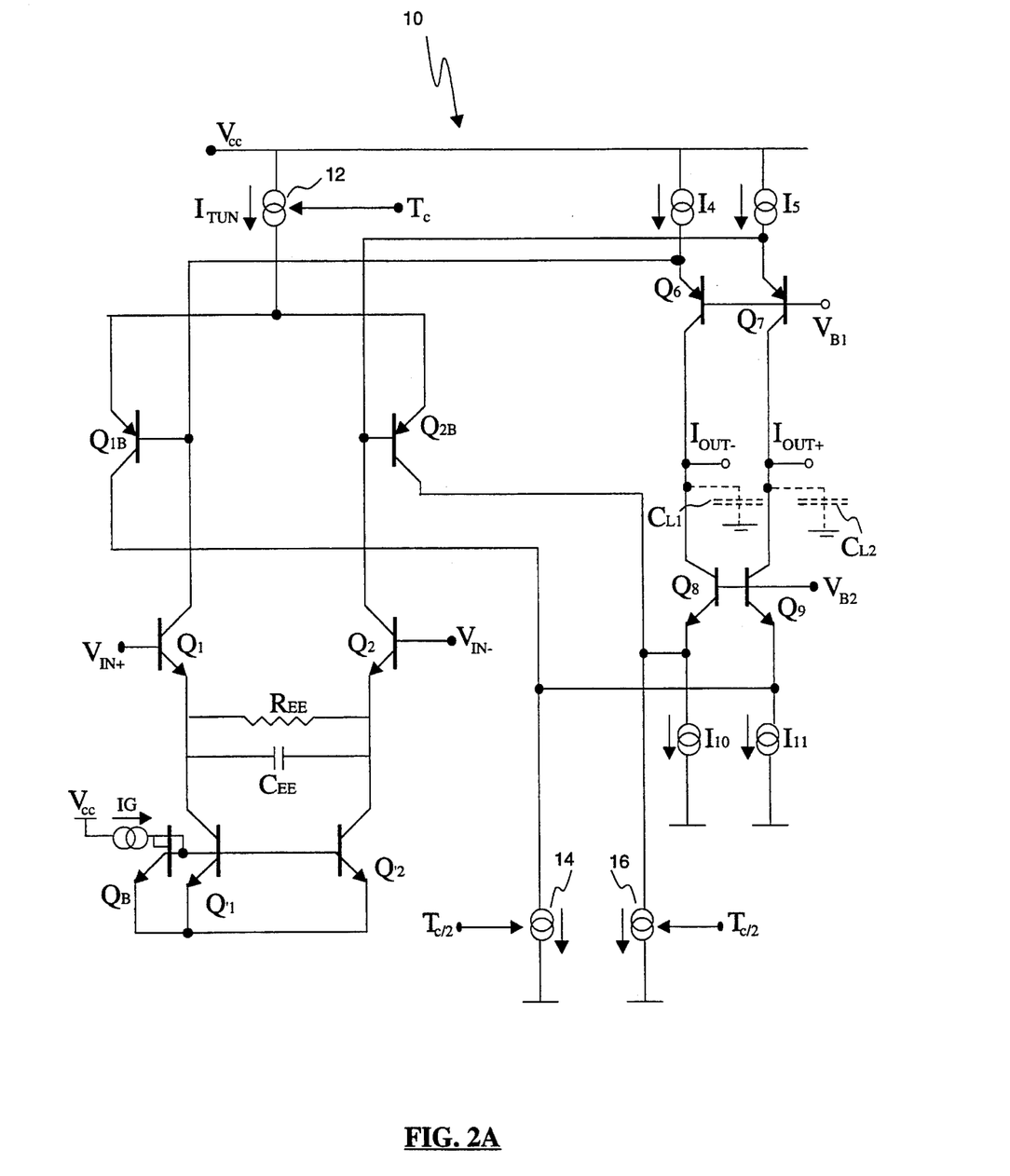
FIG. 2A shows a simplified schematic representation of an amplifier in accordance with the present invention.

Referring now to FIG. 2A, there is shown a simplified schematic representation of an amplifier 10 in accordance with the present invention. The amplifier includes an input stage having transistors $Q_1$ and $Q_2$, the emitters of which are connected by emitter resistance $R_{EE}$ and capacitance $C_{EE}$. As mentioned above, the emitter degenerative resistance $R_{EE}$ desirably reduces output distortion and input capacitance, and increases input impedance. In embodiments wherein the amplifier 10 is configured to be incorporated within a filter, the capacitance $C_{EE}$ provides a means of compensating for variation in the phase response of the amplifier over different filter passband frequencies. A differential input voltage ($V_{IN+}$, $V_{IN-}$) is received by transistors $Q_1$ and $Q_2$, which operate as a voltage-to-current converter. The transistors $Q_1$ and $Q_2$ are biased by a current source network comprised of $Q_{1'}$, $Q_{2'}$, $Q_B$ and $I_B$.

The inventive amplifier further includes a common-base cascode output stage comprised of transistors $Q_6$ and $Q_7$. The cascode stage transistors $Q_6$ and $Q_7$ are biased by current sources $I_4$ and $I_5$, with transistors $Q_8$–$Q_{11}$ serving as an active load for the cascode stage. The transistor bias voltages $V_{B1}$ and $V_{B2}$ may be derived in a conventional manner from bias circuitry (not shown) which is independent of processing and temperature variation.

Referring again to FIG. 2A, the inventive amplifier further includes a tuning circuit which, in a preferred embodiment, comprises an intermediate gain stage realized using transistors $Q_{1B}$ and $Q_{2B}$. The transistors $Q_{1B}$ and $Q_{2B}$ of the intermediate gain stage are seen to be coupled between the differential input stage and the cascode output stage. It is observed that the PMOS differential pair $Q_{1B}$–$Q_{2B}$, together with the common-base cascode transistors $Q_8$ and $Q_9$, function to vary the transconductance of the inventive amplifier by varying the magnitude of the tuning current $I_{TUN}$. The current source 12 furnishing the tuning current $I_{TUN}$ to the common emitter node of $Q_{1B}$ and $Q_{2B}$, as well as the pair of current sources 14 and 16, each nominally drawing one-half of the tuning current $I_{TUN}$ from the collectors of $Q_{1B}$ and $Q_{2B}$, may be realized using conventional transistor-based adjustable current sources familiar to those skilled in the art. Similar current sources $I_4$, $I_5$, $I_{10}$ and $I_{11}$ are used to provide a fixed current to each of the transistors $Q_6$–$Q_9$. In accordance with the invention, the intermediate gain stage transistors $Q_{1B}$ and $Q_{2B}$ serve to make the transconductance gain of the amplifier a function of the tuning current $I_{TUN}$. This advantageously allows the amplifier to be tuned to receive input signals over a wide dynamic range through adjustment of the magnitude of $I_{TUN}$.

Again assuming a large (e.g., 5 kΩ) degenerative emitter resistance $R_{EE}$, the short circuit transconductance $G_m$ for the amplifier of FIG. 2A may be expressed as:

$$G_m = V_{IN+}/I_{OUT+} = /R_{EE}/1(1+g_{m6}/g_{m1B}) = R_{EE}/1(1+I_B/I_{TUN}) = G_{m0}(1+I_B/I_{TUN})$$

where the transconductance $G_m$ is seen to become equal to the fixed value of $G_{m0}$ for $I_{TUN}=0$.

In operation, the fraction of the tuning current $I_{TUN}$ from current source 12 respectively flowing through each of the intermediate gain stage transistors $Q_{1B}$ and $Q_{2B}$ varies as a function of the differential input voltage ($V_{IN+}-V_{IN-}$). When the differential input forces the entire $I_{TUN}$ current through $Q_{1B}$, the KCL equilibrium equation at the emitter of $Q_9$ yields:

$$I_{EQ9_{max}}+2I_{TUN}=I_{TUN}+I_B$$

$$I_{EQ9_{max}}=I_B-I_{TUN}$$

It follows that $Q_9$ is in the forward active mode until the magnitude of $I_{TUN}$ is raised to the level of $I_B$. At this point $Q_9$ cuts off, and no change in transconductance occurs for further increases in $I_{TUN}$. Hence, the value of $G_m$ reaches a maximum (i.e., $2G_{m0}$) when $I_{TUN}=I_B$, which corresponds to a 2:1 linear tuning range. The maximum value of $G_m$ increases when the value of $R_{EE}$ is reduced and the magnitude of $I_B$ is augmented, and decreases when $R_{EE}$ and $I_B$ are adjusted in the opposite manner.

Figure 2B:
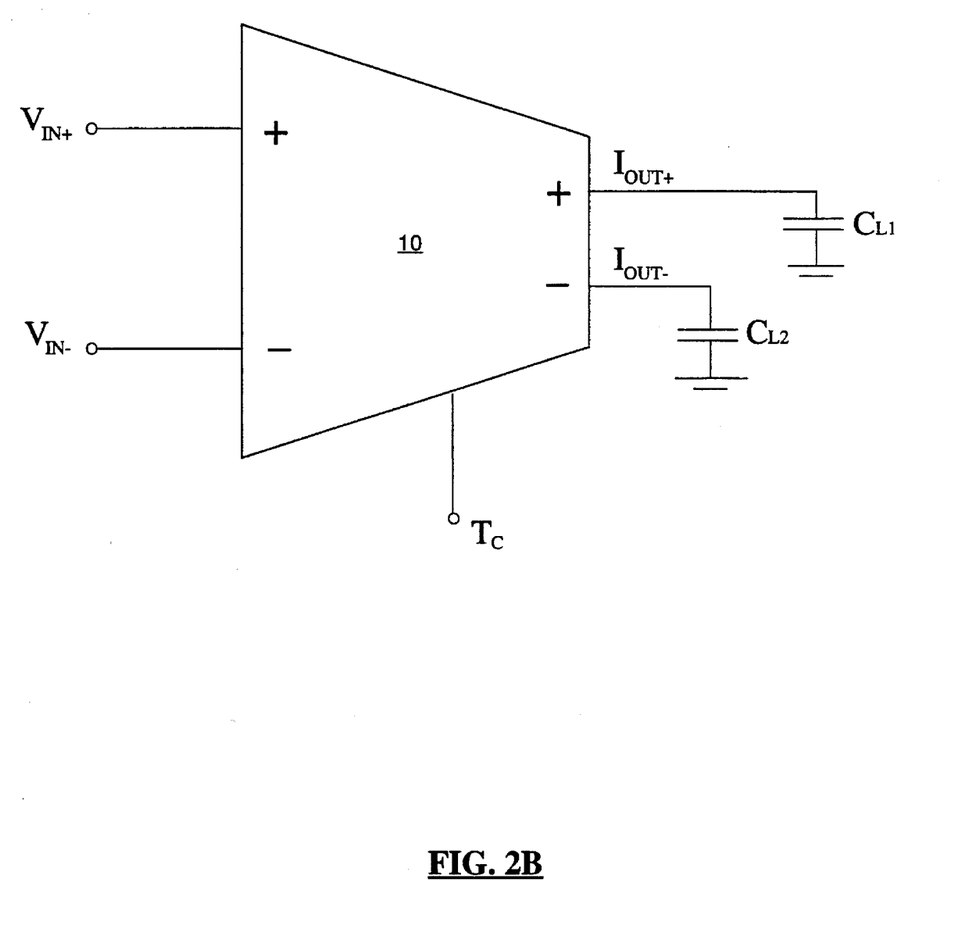
FIG. 2B provides a block diagram representation of a differential operational transconductance amplifier of the invention configured as an integrator.

Referring now to FIG. 2B, there is shown a block diagram representation of the OTA 10 configured as an integrator. In the embodiment of FIG. 2B, control over the tuning current $I_{TUN}$ is effected by adjustment of a tuning control signal $T_C$. The integrator of FIG. 2B may be interconnected with other integrators of like kind in order to realize various types of continuous-time active filters, a particular example of which is described below with reference to FIG. 5. The capacitive loading upon the output cascode stage resulting from such interconnection is illustratively represented in FIG. 2B by capacitances $C_{L1}$ and $C_{L2}$, which are also shown in phantom in FIG. 2A.

Figure 3A:
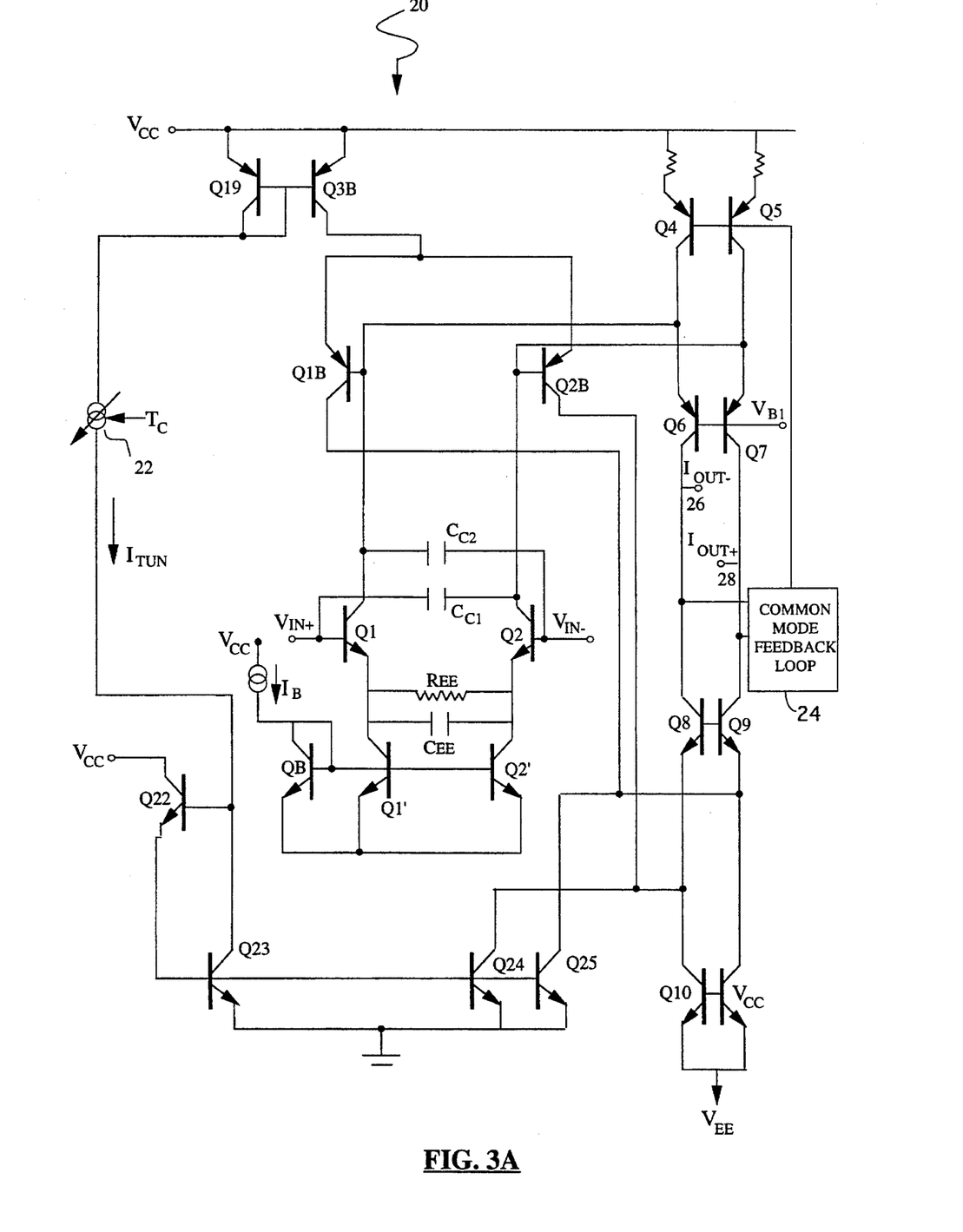
FIG. 3A depicts a more detailed schematic representation of a transconductance amplifier in accordance with the invention.

Turning now to FIG. 3A, there is depicted a more detailed schematic representation of a transconductance amplifier 20 in accordance with the invention. As is indicated by FIG. 3A, $Q_{1B}$ and $Q_{2B}$ are biased by a tuning current generated by a tuning circuit comprising transistors $Q_{3B}$, $Q_{19}$, $Q_{22}$–$Q_{25}$, and adjustable current source 22. In the embodiment of FIG. 3A the transistors $Q_{22}$–$Q_{25}$ and the active load transistors $Q_8$–$Q_{11}$ are of a first conductivity type (i.e., NPN), while PNP transistors $Q_{19}$ and $Q_{3B}$ and the intermediate gain PNP transistors $Q_{1B}$ and $Q_{2B}$ are of the opposite conductivity type.

Figure 3B:
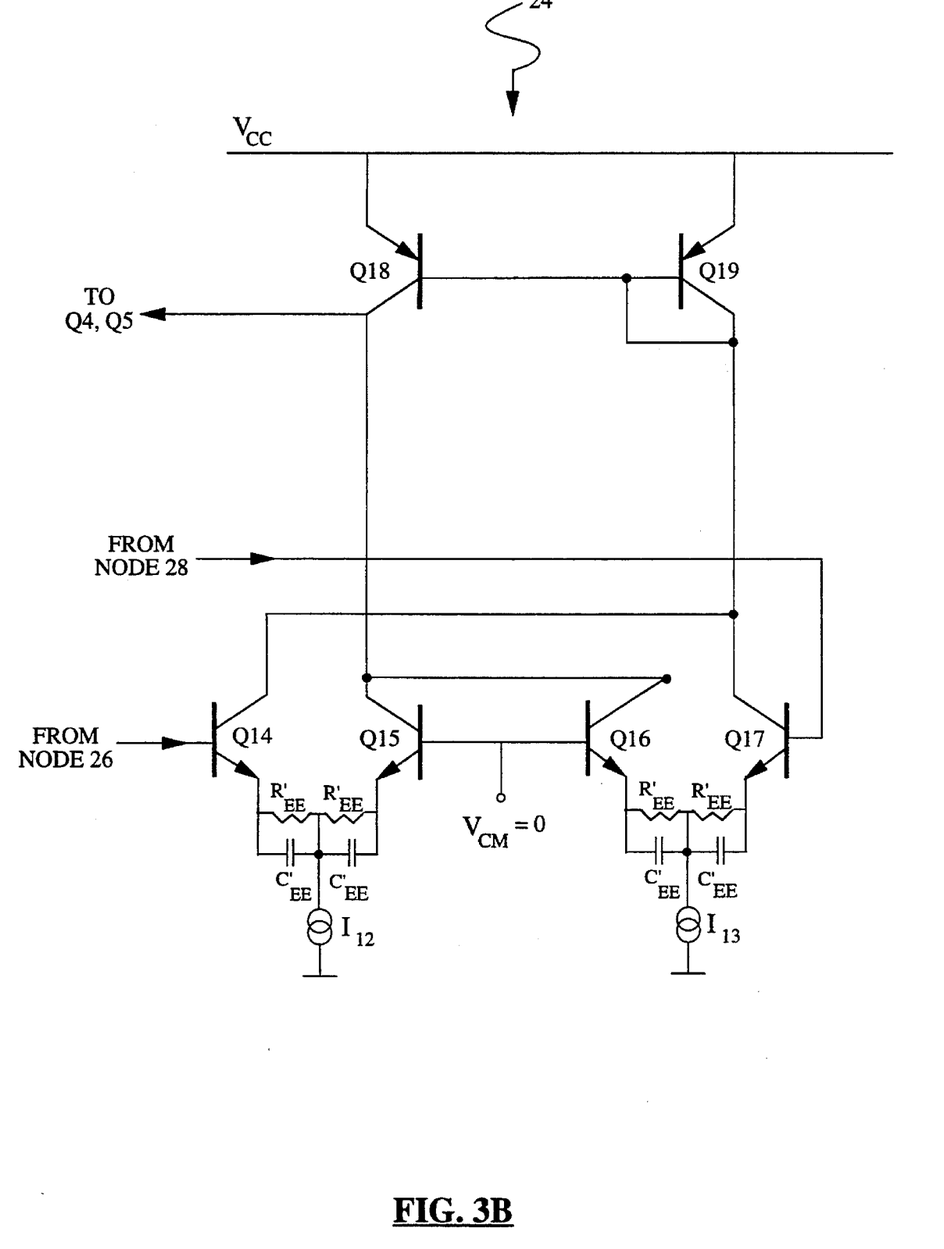
FIG. 3B schematically represents a common-mode feedback loop for stabilizing the common-mode output of the amplifier of FIG. 3A by controlling the bias applied to the amplifier output stage.

The common-mode output of the amplifier 20 at output nodes 26 and 28 may be stabilized by controlling the bias voltages of $Q_4$ and $Q_5$ using a common-mode feedback loop 24, which is schematically represented in FIG. 3B. Referring to FIG. 3B, the common-mode feedback loop 24 includes NPN bipolar transistors $Q_{14}$–$Q_{17}$ and PNP bipolar transistors $Q_{18}$–$Q_{19}$. Current sources $I_{12}$ and $I_{13}$ provide bias current to the differential pairs $Q_{14}$–$Q_{15}$ and $Q_{16}$–$Q_{17}$. The differential currents of the two differential pairs, $Q_{14}$–$Q_{15}$ and $Q_{16}$–$Q_{17}$, are summed into the current-mirror load $Q_{18}$–$Q_{19}$ with output taken from $Q_{18}$ to control the biasing of $Q_4$–$Q_5$. Resistors $R'_{EE}$ minimize the loading of the common-mode feedback loop 24 upon the output nodes 26 and 28, and also expand the range over which the common-mode feedback loop operates in a linear mode. The common-mode reference voltage $V_{CM}$ applied to the feedback loop 24 will typically be nulled ($V_{CM}$=0) to maximize signal swing at the output nodes 26 and 28. Shunt-peaking capacitors $C'_{EE}$ are appended to differential pairs $Q_{14}$–$Q_{15}$ and $Q_{16}$–$Q_{17}$ to provide high-frequency stability for the common-mode feedback loop 24.

Figure 4A:
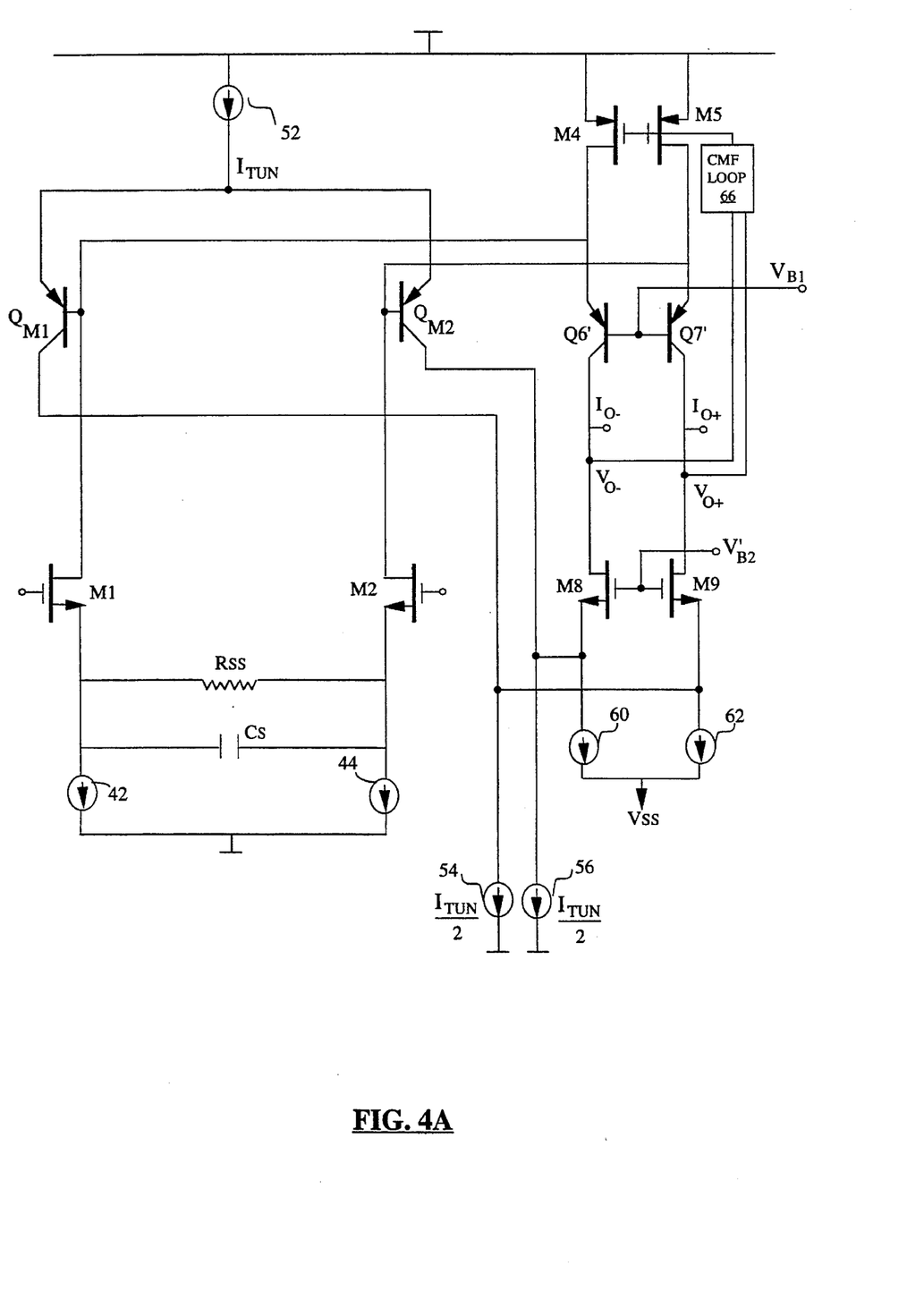
FIG 4A shows a bipolar/CMOS(BiCMOS) implementation of a transconductance amplifier in accordance with the invention.

Turning now to FIG. 4A, there is shown a complementary Bipolar/CMOS (i.e., BiCMOS) implementation of a transconductance amplifier 40 in accordance with the invention. The amplifier 40 is of a substantially similar topology to the amplifier 30, but utilizes MOS transistors to realize the input differential stage and active load. For example, the input differential stage includes first and second NMOS transistors M1 and M2 biased by current sources 42 and 44. A source resistance $R_{SS}$, in parallel with source capacitance $C_S$, connect the source terminals of the first and second NMOS transistors M1 and M2.

The intermediate gain stage is comprised of a pair of PNP bipolar transistors, which in the embodiment of FIG. 4A are identified as $Q_{M1}$ and $Q_{M2}$. As is indicated by FIG. 4A, a tuning current $I'_{TUN}$ is provided by a current source 52 to transistors $Q_{M1}$ and $Q_{M2}$ of the intermediate gain stage. A current of $I_{TUN}/2$ is drawn by each of the current sources 54 and 56 through the intermediate gain stage transistors $Q_{M1}$ and $Q_{M2}$. At the output stage, a pair of PMOS transistors M4 and M5 are seen to provide bias current to the common-base cascode arrangement of PNP bipolar transistors $Q'_6$ and $Q'_7$. The cascode-type output stage drives an active load consisting of NMOS transistors M8 and M9, which are respectively biased by current sources 60 and 62. The common-mode component of output voltages $V_{0-}$ and $V_{0+}$ may be stabilized by using a common-mode feedback (CMF) loop 66 to set the gate bias of PMOS transistors M4 and M5, which enables control to be exercised over the bias current provided to the cascode stage transistors $Q'_6$ and $Q'_7$.

Figure 4B:
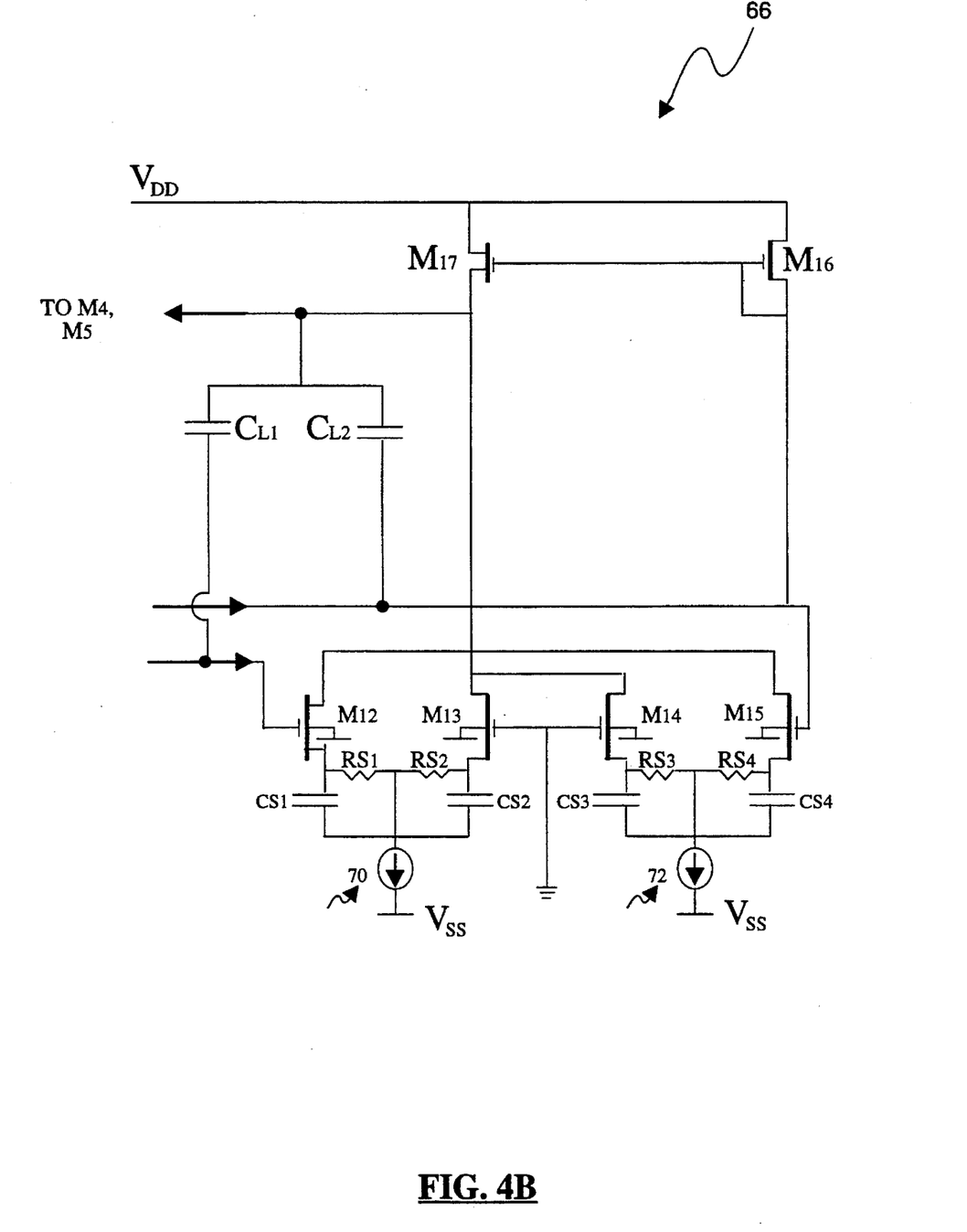
FIG. 4B schematically represents a common-mode feedback loop for stabilizing the common-mode output of the BiCMOS amplifier shown in FIG. 4A.

Turning now to FIG. 4B, the CMF loop 66 includes a PMOS transistor M17 having a drain terminal connected to the gate of PMOS transistors M4 and M5. A current mirror is formed by PMOS transistor M17 and another PMOS transistor M16, the drains of which are coupled to NMOS differential transistor pairs comprised of M12–M13, and M14–M15. The NMOS differential pairs are biased by current sources 70 and 72. As is indicated by FIG. 4B, resistors $R_{S1}$, $R_{S2}$ connected in parallel with capacitors $C_{S1}$, $C_{S2}$ are appended to each NMOS differential pair. High frequency stability of the CMF loop is improved as a result of connection of a differentially-grounded CMF output node 78 to the inputs of the CMF loop 66 via load capacitances $C_{L1}$ and $C_{L2}$.

Figure 5:
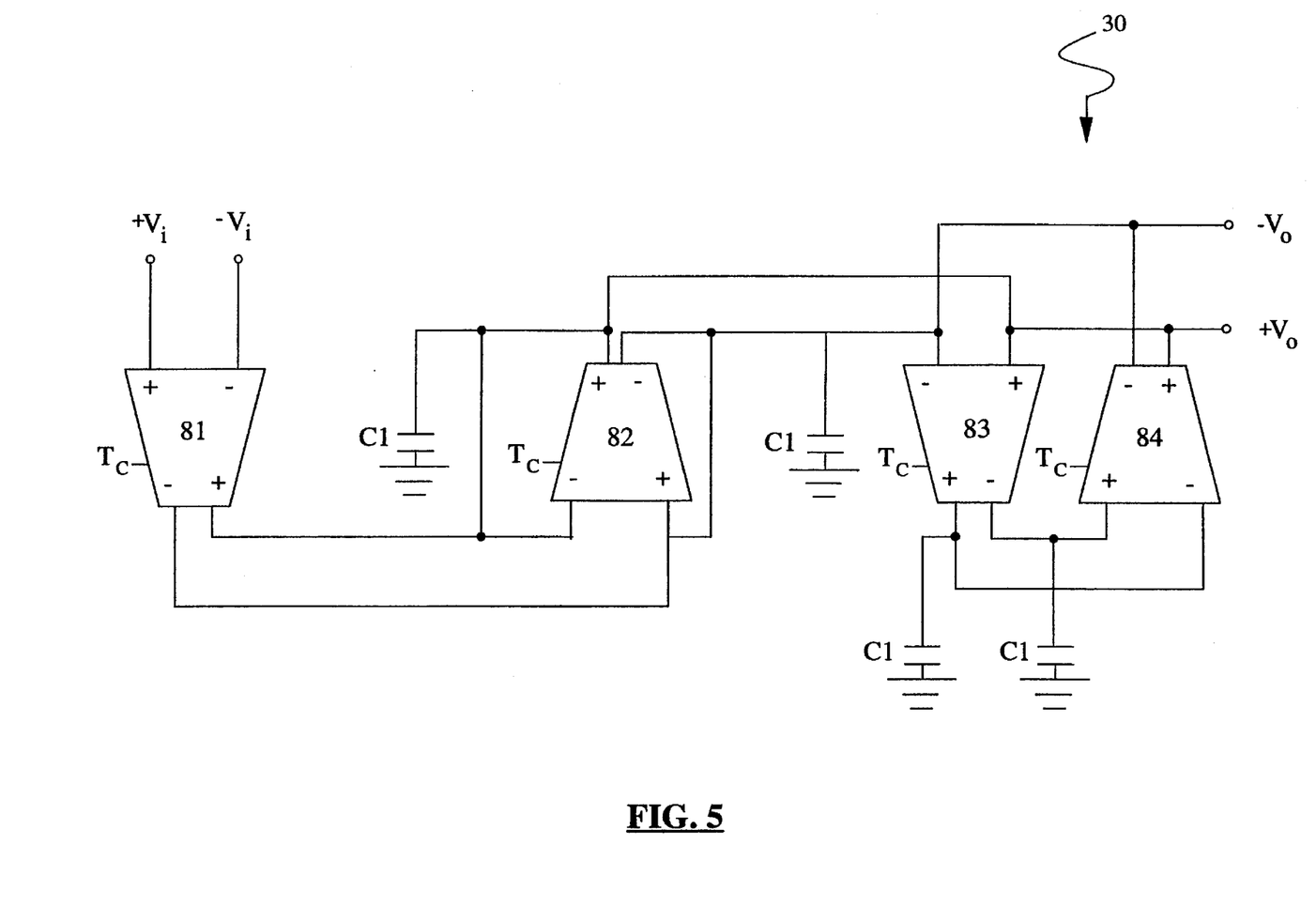
FIG. 5 shows an exemplary biquadratic filter incorporating a set of four operational transconductance amplifiers realized in accordance with the present invention.

FIG. 5 shows an exemplary biquadratic filter 80 incorporating a set of four operational transconductance amplifiers (OTAs) 81–84 realized in accordance with the present invention. The biquadratic filter 80 may be utilized to implement the equivalent of, for example, an RLC bandpass filter. Those skilled in the art will readily appreciate that the OTA of the invention may also be used to realize other types of continuous-time active filters (e.g., Chebyshev and Elliptic filters). The OTA 81 is seen to be addressed by a differential filter input voltage ($+V_i$, $-V_i$), with the OTA 84 producing the output ($+V_o$, $-V_o$) in response thereto. The values of capacitors C1 and C2, as well as the tuning current control signal $T_C$ used to set the level of $I_{TUN}$, are set as necessary to achieve the desired filter response characteristics.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed:

1. In an amplifier including an input stage for receiving an input signal and an output stage, a tuning circuit comprising:

a differential gain stage for varying transconductance gain of said amplifier over a predefined tuning range in response to a tuning current provided thereto, said differential gain stage being connected between said input and output stages wherein said output stage includes first and second tuning circuit transistors connected in parallel to said differential gain stage.

2. The tuning circuit of claim 1 wherein said first and second tuning circuit transistors comprise bipolar transistors connected in a common-base configuration.

3. The tuning circuit of claim 1 wherein said differential gain stage includes a third transistor having an output node coupled to the first tuning circuit transistor, and a fourth transistor connected to the second tuning circuit transistor.

4. An amplifier comprising:

an input stage for converting a differential input voltage to an input current;

an output circuit connected to receive said input current;

a differential gain stage including a differential transistor pair connected to said input stage and to said output circuit;

means for providing a tuning current to said differential gain stage, said differential gain stage being disposed to vary transconductance gain of said amplifier over a predefined tuning range in accordance with changes in said tuning current wherein said transconductance gain of said amplifier is equivalent to a nominal transconductance when said tuning current is at a minimum;

wherein said changes in said tuning current over said predefined tuning range result in corresponding changes in current flow through said output circuit.

5. The amplifier of claim 4 wherein said input stage includes a differential transistor pair, and wherein said output circuit includes first and second bipolar transistors connected in a common-base configuration.

6. The operational transconductance amplifier of claim 4 further including a common-mode feedback loop coupled to said output circuit.

7. An operational transconductance amplifier comprising:

an input stage including a differential pair of transistors of a first conductivity type;

an output amplifier stage, connected to said input stage, including a pair of output transistors of a conductivity opposite to said first conductivity type;

a tuning circuit connected to said input stage and to said output amplifier stage for varying transconductance gain of said amplifier over a predefined tuning range in accordance with changes in a tuning current, said tuning circuit including a pair of tuning transistors of said conductivity opposite to said first conductivity type.

8. In an amplifier including a differential input stage for receiving an input signal and an output stage, the combination comprising:

a degenerative emitter resistance coupled to said differential input stage;

an adjustable current source for generating a tuning current in response to a tuning control signal;

a tuning circuit comprising a differential gain stage for linearly varying transconductance gain of said amplifier as a function of change in said tuning control signal, said differential gain stage being connected between said input and output stages.

9. The amplifier of claim 8 wherein said differential gain stage includes a first transistor having a control terminal connected to a first output of said input stage, and a second transistor having a control terminal connected to a second output of said input stage.

10. In a folded cascode amplifier including an input stage for receiving an input signal, an output stage, and an emitter resistance coupled to said input stage, said emitter resistance being selected to be of a magnitude sufficient to result in said amplifier exhibiting substantially linear transconductance gain, a tuning circuit comprising:

a differential gain stage for varying said transconductance gain of said amplifier over a predefined tuning range in response to a tuning current provided thereto, said differential gain stage being connected between said input and output stages.

11. In an amplifier including a differential input stage for receiving a differential input signal and a differential output stage, a tuning circuit comprising:

a differential gain stage for linearly varying transconductance gain of said amplifier over a predefined tuning range in response to a tuning current provided thereto, said differential gain stage being connected between said differential input stage and said differential output stage.

* * * * *

UNITED STATES PATENT AND TRADEMARK OFFICE
CERTIFICATE OF CORRECTION

PATENT NO. : 5,465,072

DATED : November 7, 1995

INVENTOR(S) : Atarodi

It is certified that error appears in the above-indentified patent and that said Letters Patent is hereby corrected as shown below:

Delete Drawing Sheets 1, 5, and 8, and substitute therefor the Drawing Sheets consisting of FIGS. 1, 3A, and 5, as shown on the attached pages.

At column 4, lines 20-23, delete
"$G_m = V_{IN+}/I_{OUT+} = /R_{EE}/1(1+g_{m6}/g_{m1B}) = R_{EE}/1(1+I_B/I_{TUN}) = G_{m0}(1+I_B/I_{TUN})$",
insert --$G_m = I_{OUT+}/V_{IN+} = 1/R_{EE}(1+g_{m1B}/g_{m6}) = 1/R_{EE}(1+I_{TUN}/I_B) = G_{m0}(1+I_{TUN}/I_B)$--

Signed and Sealed this

Eighteenth Day of June, 1996

Attest:

BRUCE LEHMAN

*Attesting Officer*     *Commissioner of Patents and Trademarks*